(12) United States Patent
Sato et al.

(10) Patent No.: US 12,052,842 B2
(45) Date of Patent: Jul. 30, 2024

(54) BLANK PANEL

(71) Applicant: Nippon Telegraph and Telephone Corporation, Tokyo (JP)

(72) Inventors: Noriyuki Sato, Musashino (JP); Kosuke Watanabe, Musashino (JP); Mineki Ogata, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 337 days.

(21) Appl. No.: 17/625,438

(22) PCT Filed: Jul. 18, 2019

(86) PCT No.: PCT/JP2019/028295
§ 371 (c)(1),
(2) Date: Jan. 7, 2022

(87) PCT Pub. No.: WO2021/009910
PCT Pub. Date: Jan. 21, 2021

(65) Prior Publication Data
US 2022/0264760 A1 Aug. 18, 2022

(51) Int. Cl.
*H05K 7/18* (2006.01)
(52) U.S. Cl.
CPC ..................... *H05K 7/18* (2013.01)
(58) Field of Classification Search
CPC ................ H05K 7/18; H05K 7/183
See application file for complete search history.

(56) References Cited

U.S. PATENT DOCUMENTS

| | | | | |
|---|---|---|---|---|
| 6,695,149 B1 * | 2/2004 | Cote | ................. | H05K 7/183 403/397 |
| 7,255,409 B2 * | 8/2007 | Hu | ................. | A47B 88/43 312/334.4 |
| 7,506,768 B2 * | 3/2009 | Rassmussen | ........ | H05K 7/1425 211/183 |
| 7,959,015 B2 * | 6/2011 | Sempliner | ............ | H05K 7/1461 211/26 |
| 8,562,086 B1 * | 10/2013 | Baik | ................. | A47B 88/931 312/334.4 |
| 8,701,902 B2 * | 4/2014 | Oura | ................. | H05K 7/1421 312/334.3 |
| 11,510,335 B2 * | 11/2022 | Alharbi | ................. | H05K 7/1489 |
| 11,596,080 B2 * | 2/2023 | Liu | ................. | H05K 7/1489 |

(Continued)

OTHER PUBLICATIONS

[No Author Listed] [online], "19 inch panel," Settsu Material Industrial Co., Ltd., available on or before Jan. 22, 2011, retrieved on Jul. 1, 2019, retrieved from URL <http://www.settsu.co.jp/catalogs/smasrc/47>, 5 pages (with English Translation).

(Continued)

*Primary Examiner* — Daniel J Rohrhoff
(74) *Attorney, Agent, or Firm* — Fish & Richardson P.C.

(57) ABSTRACT

In the case in which a blank panel having holes is mounted obliquely on a rack having holes, the blank panel includes an alignment mechanism for aligning the holes with the holes having a misalignment. For example, the alignment mechanism is a mechanism which causes the blank panel to have a shape in which corners of the blank panel are cut out.

16 Claims, 9 Drawing Sheets

(56) References Cited

U.S. PATENT DOCUMENTS

| | | | | |
|---|---|---|---|---|
| 2001/0040142 A1* | 11/2001 | Haney | ............ | H05K 7/1489 211/183 |
| 2002/0153338 A1* | 10/2002 | Orr | ............ | A47B 47/03 211/183 |
| 2002/0195408 A1* | 12/2002 | Hegrenes | ............ | H05K 7/183 312/265.4 |
| 2004/0232098 A1* | 11/2004 | Orr | ............ | H05K 7/183 211/183 |
| 2008/0310126 A1* | 12/2008 | Lakoduk | ............ | H05K 7/1425 361/731 |
| 2009/0059486 A1* | 3/2009 | Taylor | ............ | H05K 7/1488 361/679.02 |
| 2011/0186532 A1* | 8/2011 | Wu | ............ | A47B 96/00 312/324 |
| 2014/0144858 A1* | 5/2014 | Yokosawa | ............ | H05K 7/183 211/182 |
| 2015/0060382 A1* | 3/2015 | Drewery | ............ | H05K 7/20745 211/183 |
| 2016/0205812 A1* | 7/2016 | Curtin | ............ | H05K 7/20736 361/679.46 |
| 2018/0132375 A1* | 5/2018 | Drake | ............ | H05K 7/20736 |
| 2022/0256725 A1* | 8/2022 | Sato | ............ | H05K 7/1488 |
| 2023/0189455 A1* | 6/2023 | Lu | ............ | H05K 7/20272 312/223.2 |

OTHER PUBLICATIONS

[No Author Listed] [online], "About 19 inch standard," Settsu Material Industrial Co., Ltd., available on or before Mar. 30, 2009, retrieved on Jul. 1, 2019, retrieved from URL <https://www.settsu.co.jp/technique/nineteeninch/>, 5 pages (with English Translation).

* cited by examiner

BLANK PANEL

CROSS-REFERENCE TO RELATED APPLICATIONS

This application is a National Stage application under 35 U.S.C. § 371 of International Application No. PCT/JP2019/028295, having an International Filing Date of Jul. 18, 2019. The disclosure of the prior application is considered part of the disclosure of this application, and is incorporated in its entirety into this application.

TECHNICAL FIELD

The invention relates to a blank panel.

BACKGROUND ART

A blank panel may be mounted on a rack storing a device such as a server. A blank panel is a member which covers a portion of the entire rack on which no device is mounted. A blank panel may have vents for ventilation to ensure an air flow in the rack, may have a unit for holding a member such as a cable, which is connected to the device such that the member is held, and may have a function of serving as connection port for members by having a connection point for members such as a connector. Specific examples of the blank panel are disclosed in, for example, Non Patent Literature (NPL) 1 and 2.

CITATION LIST

Non Patent Literature

NPL 1: Settsu Metal Industrial Co., Ltd., "Regarding the 19-Inch Standard", [online], [Search on Jul. 1, 2019], Internet: <URL: https://www.settsu.co.jp/technique/nineteeninch/>

NPL 2: Settsu Metal Industrial Co., Ltd., "19-inch panel", [online], [Search on Jul. 1, 2019], internet <URL: http://www.settsu.co.jp/catalogs/smasrc/47>

SUMMARY OF THE INVENTION

Technical Problem

A blank panel is designed so that the blank panel can be mounted even if a mounting position when the blank panel is mounted on the rack with screws or the like is slightly misaligned from a standard position. That is, a blank panel is designed so that misalignment of the mounting position when it is mounted on a rack is within an allowable range.

However, a rack after a start of service operation may become deformed over time, and misalignment of the mounting position when a blank panel is mounted on the rack may exceed an allowable range. In such a case, conventionally, mounting of a blank panel on a rack may not be reliable, or mounting thereof may not be possible. Because a blank panel is often mounted for the purpose of preventing leakage of air, leakage of electromagnetic waves, entry of small animals, and the like, reliable mounting on a rack is required.

Also, in a rack, other devices may be mounted adjacent to a blank panel. In this case, a blank panel which is not reliably mounted may interfere with other devices and may affect the functions and the performance of such other devices. To avoid such a possibility, reliable mounting on a rack is required.

In view of such circumstances, an object of the present invention is to ensure that a blank panel is mounted on a rack even when the rack becomes deformed.

Means for Solving this Problem

In order to solve the problems described above, the present invention is a blank panel including an alignment mechanism configured to align a blank panel side hole with a rack side hole having a misalignment, when the blank panel having the blank panel side hole is mounted obliquely on a rack having the rack side hole.

Effects of Invention

According to the invention, it is possible to ensure that a blank panel is mounted on a rack even when the rack is deformed.

DESCRIPTION OF EMBODIMENTS

Hereinafter, embodiments for carrying out the present invention (hereinafter, referred to as "the present embodiment") will be described with reference to the accompanying drawings. For convenience of explanation, in the drawings referred to in the description of the present embodiments, the shape and dimensions may be exaggerated compared to the actual shape and dimensions.

Comparative Example

Figure 7:
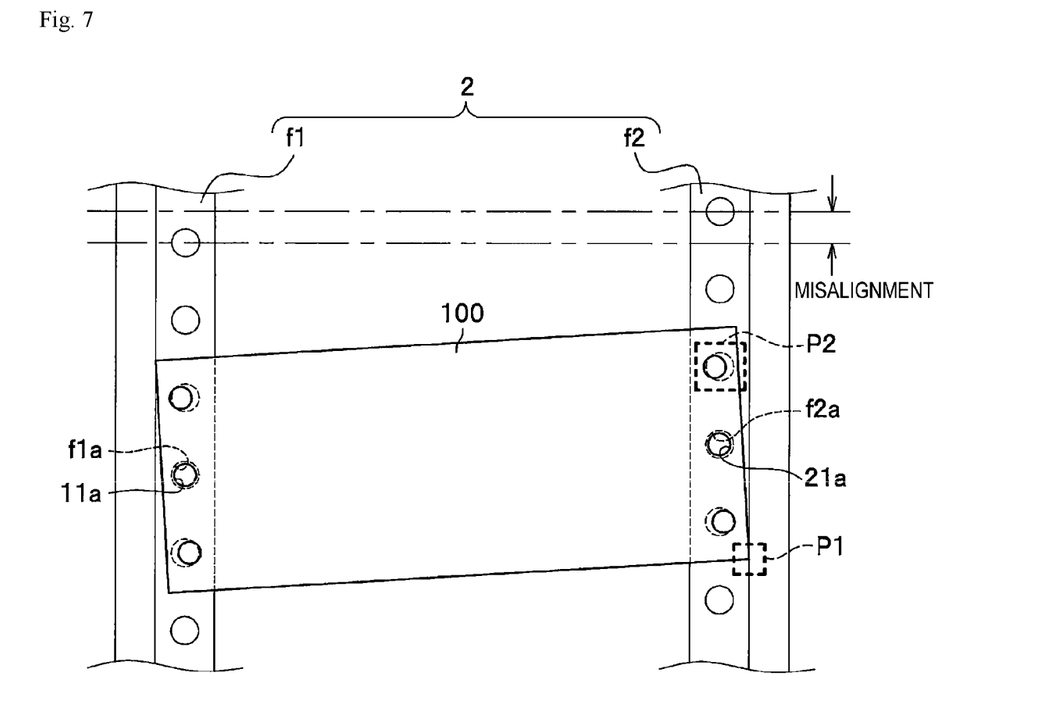
FIG. 7 is an explanatory diagram of first and second problems in a blank panel of a comparative example.

As illustrated in FIG. 7, for example, it is assumed that a rack 2 is deformed over time, and positions of screwing holes f1a and f2a (rack side holes) formed in left and right frames f1 and f2 of the rack 2 are misaligned vertically. A plurality of holes f1a and f2a are present and are arranged vertically. In this case, a blank panel 100 of the comparative example is tilted and mounted on the deformed rack 2. More specifically, a plurality of holes 11a and 21a on both the left and right sides of the blank panel 100 are aligned with and screwed into the misaligned holes f1a and f2a.

Figure 8:
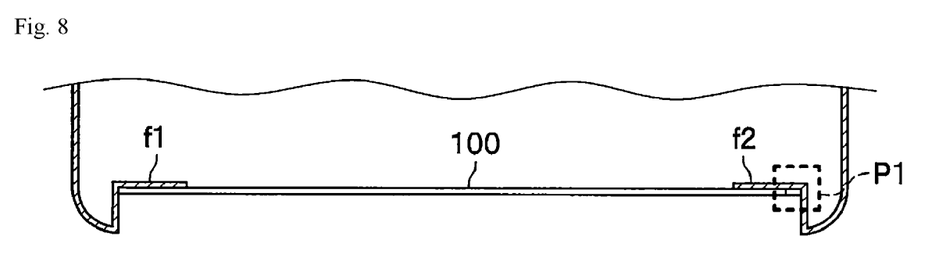
FIG. 8 is a diagram of the blank panel of FIG. 7 when seen from above.

As illustrated in FIG. 8, a shape of the frames f1 and f2 of the rack 2 may be a shape including a surface in which the holes f1a and f2a are formed and a wall surface which stands upright from the surface and restricts left and right positions of the blank panel 100, but the shape of the frames f1 and f2 is not limited to this shape. In addition, although in FIG. 7 there are three holes for 11a and 21a respectively, the embodiments which will be described later are applicable even when the number of such holes is two or less or four or more.

However, when the blank panel 100 is mounted obliquely, there is a first problem, as indicated by reference sign p1 in FIGS. 7 and 8. The first problem is that corners of the blank panel 100 come into contact with the rack 2 and interfere with the rack 2, an amount of oblique displacement is limited, and the alignment of the holes f1a and f2a of the rack 2 with the holes of the blank panel 100 is hindered.

In addition, when the blank panel 100 is mounted obliquely, there is a second problem, as indicated by reference sign p2 in FIG. 7. The second problem is that positions of specific holes 11a and 21a of the blank panel 100 do not align with positions of the specific holes f1a and f2a of the rack 2, making it difficult to screw the blank panel to the rack.

Figure 9:
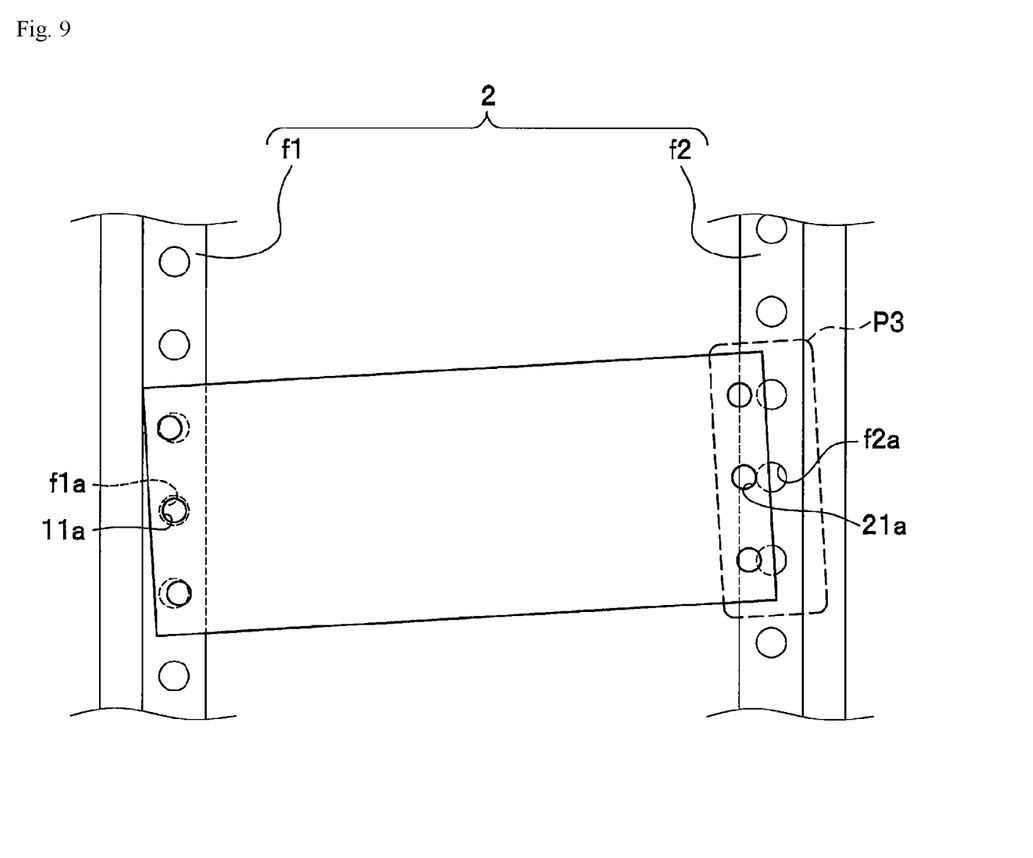
FIG. 9 is an explanatory diagram of a third problem in the blank panel of the comparative example.

In addition, when the blank panel 100 is mounted obliquely, there is a third problem, as indicated by reference sign p3 in FIG. 9. The third problem is that, because a distance between the holes f1a and f2a of the rack 2 is substantially increased due to deformation of the rack 2, the hole 21a does not reach the hole f2a of the rack, making it impossible to screw the blank panel to the rack even when the blank panel 100 is intended to be mounted obliquely.

Each of the first to third problems may be a cause that hinders reliable mounting of the blank panel 100 on the rack 2. The present embodiments achieve oblique mounting of the blank panel on the deformed rack to solve the first to third problems.

First Embodiment

Figure 1:
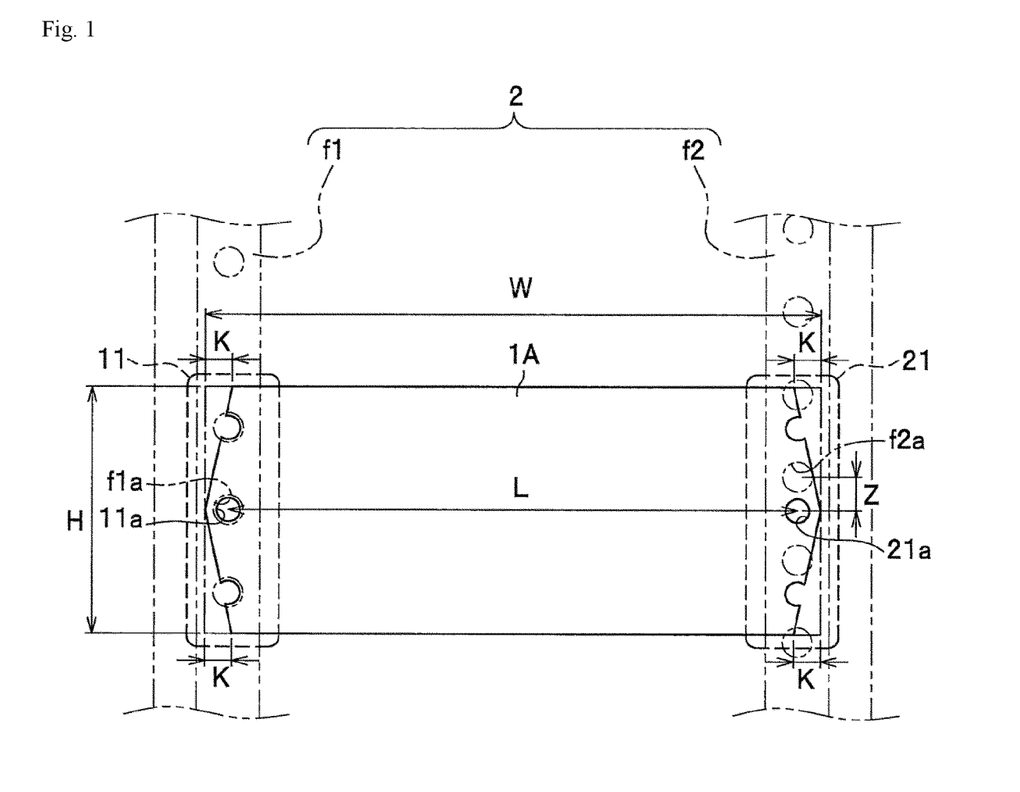
FIG. 1 is a front view of a blank panel of a first embodiment.

In describing a first embodiment, description repeating that of the comparative example will be omitted, and differences therebetween will be mainly described. As illustrated in FIG. 1, the blank panel 1A of the first embodiment has a shape in which four corners are cut out from a rectangular body whose longitudinal direction runs laterally, and a side portion of the blank panel 1A is small. The blank panel 1A is disposed between the frames f1 and f2 of the rack 2.

The blank panel 1A has three holes 11a on the left side and three holes 21a on the right side (blank panel side holes) respectively formed to be arranged vertically. Although some of the holes 11a and 21a may have a shape in which a part of a ring of the hole is cut out and opened with respect to the shape of the blank panel 1A in which the four corners are cut out, this is not a factor which hinders the present invention.

The blank panel 1A includes mounting parts 11 and 21. The mounting part 11 is mounted on the frame f1. The mounting part 11 has the holes 11a. The mounting part 21 is mounted on the frame f2. The mounting part 21 has the holes 21a.

A cut-out amount K of the blank panel 1A in the lateral direction when the blank panel 1A is formed to have a shape in which the four corners are cut out can be obtained as follows. As illustrated in FIG. 1, suppose that a lateral width of the blank panel 1A (a lateral width when a cut-out portion is absent) is defined as W, a vertical width of the blank panel is defined as H, a gap between the holes 11a and 21a is defined as L, and an amount of misalignment between the holes 21a and f2a is defined as Z.

$$L:Z=(H/2):K$$

$$K=(Z\times(H/2))/L$$

$$=ZH/2L$$

The relational equation described just above can be derived. Thus, when the amount of misalignment between the holes 21a and f2a is defined as Z, the cut-out amount K of the blank panel 1A is set to be (ZH/2L) or more.

Figure 2:
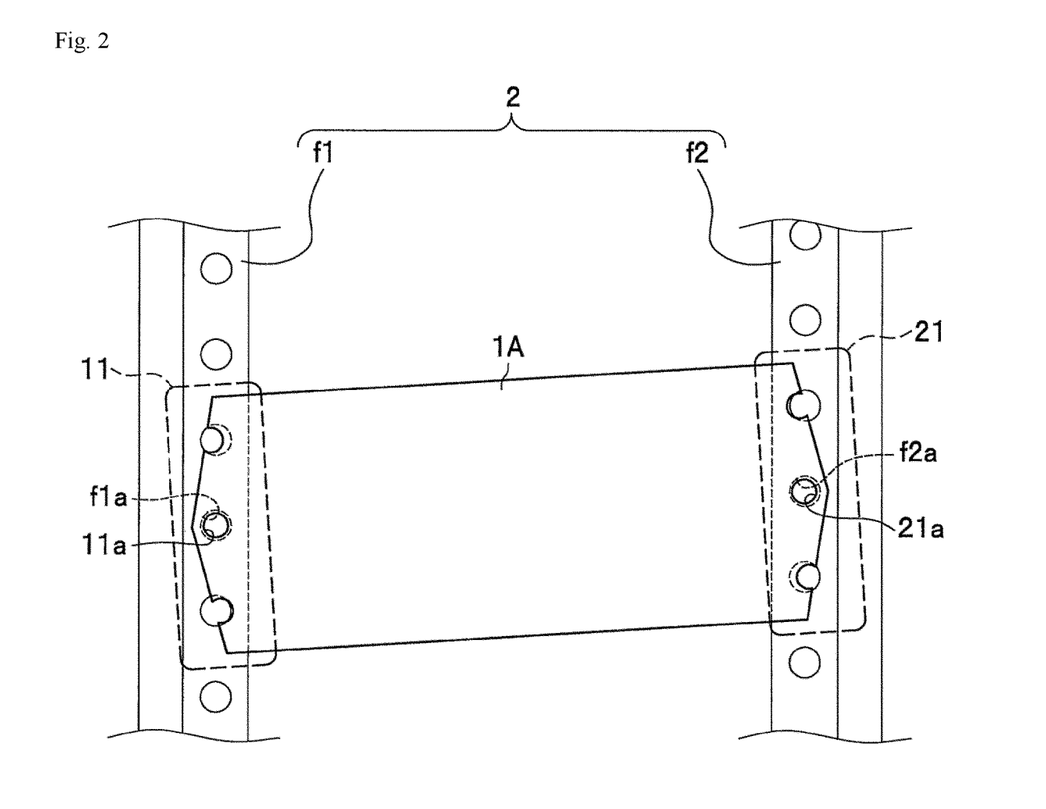
FIG. 2 is a diagram illustrating a state in which the blank panel of the first embodiment is mounted on a rack.

As illustrated in FIG. 2, the blank panel 1A is obliquely mounted on the rack 2 at an angle so that the positions of the holes 11a and f1a are aligned and the positions of the holes 21a and f2a are aligned. The mounting on the rack 2 is performed by, for example, screwing, but the present invention is not limited thereto. Further, in FIG. 2, screws and nuts used for screwing are not illustrated (the same applies to other drawings).

The blank panel 1A has a shape in which the four corners are cut out, and the side portion is small, and therefore, even when the blank panel 1A is mounted obliquely, the blank panel 1A does not come into contact with the rack 2 to interfere with the rack 2. Thus, the blank panel 1A can solve the first problem to ensure the mounting of the blank panel 1A on the rack 2.

A mechanism for causing the blank panel 1A to have a shape in which the four corners of the blank panel 1A are cut out constitutes an alignment mechanism for aligning the holes 11a and 21a of the blank panel 1A with the holes f1a and f2a of the rack 2 having a misalignment.

When the blank panel 1A is mounted obliquely, there may be the hole 11a which will be far away from the position of the hole f1a so that screwing together thereof will be difficult and the hole 21a which will be far away from the position of the hole f2a so that screwing together thereof will be difficult. In other words, however, at least one hole 11a which will be aligned with the hole f1a and at least one hole 21a which will be aligned with the hole f2a are definitely present. Thus, when the holes 11a and f1a and the holes 21a and f2a which can be reliably aligned with each other are screwed together, the mounting of the blank panel 1A on the rack 2 is ensured.

Second Embodiment

Figure 3:
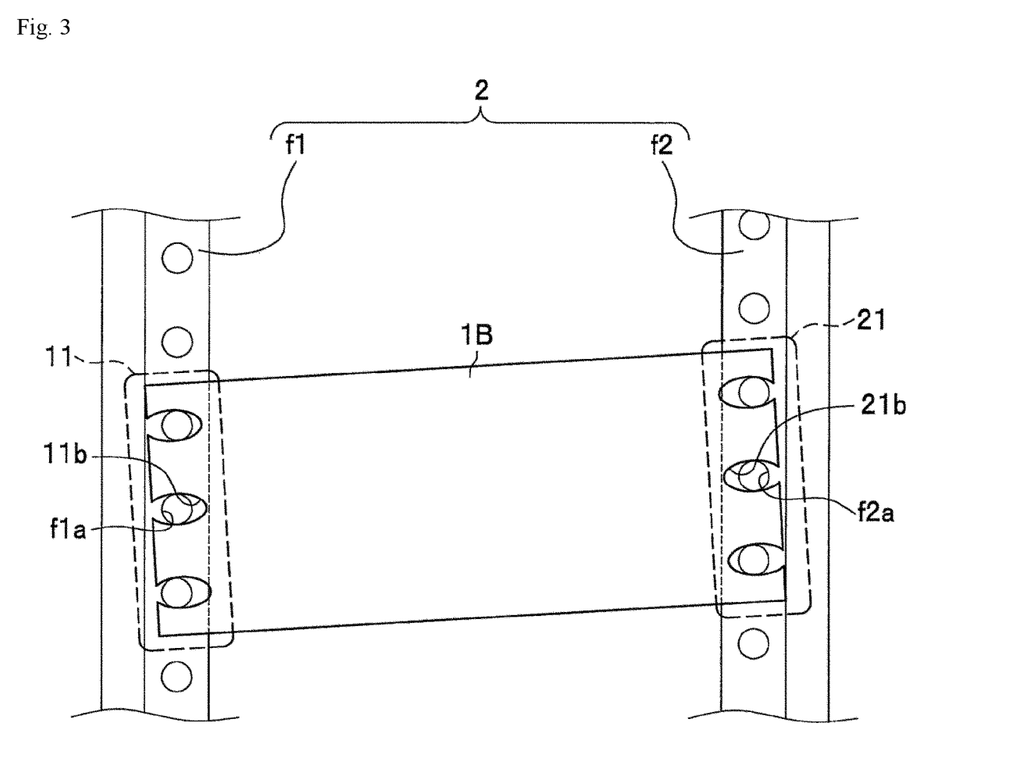
FIG. 3 is a diagram illustrating a state in which a blank panel of a second embodiment is mounted on a deformed rack.

In describing a second embodiment, description repeating that of the comparative example and the first embodiment will be omitted, and the differences will be mainly described. As illustrated in FIG. 3, a blank panel 1B of the second embodiment is a rectangular body whose longitudinal direction runs laterally. In addition, the blank panel 1B has three holes 11b on the left side and three holes 21b on the right side (blank panel side holes) respectively formed to be arranged vertically. Each of the holes 11b and 21b is a larger hole than each of the holes 11a and 21a of the blank panel 1A of the first embodiment. Although the enlarged holes 11b and 21b may exhibit a shape in which a part of a ring of the hole is cut out and opened, this is not a factor which hinders the present invention.

As illustrated in FIG. 3, the blank panel 1B is obliquely mounted on the rack 2. At this time, because the holes 11b aligned with the holes f1a and the holes 21b aligned with the holes f2a are enlarged, the entire holes f1a can communicate with partial regions of the holes 11b and the entire holes f2a can communicate with partial regions of the holes 21b. In other words, the holes 11b and 21b can absorb the misalignment with the holes f1a and f2a respectively. Thus, the blank panel 1B can solve the second problem to ensure the mounting of the blank panel 1A on the rack 2.

A mechanism in which the sizes of the holes 11b and 21b of the blank panel 1B are made large enough to communicate with the entire holes f1a and f2a of the rack 2 having a misalignment constitutes an alignment mechanism for aligning the holes 11a and 21a of the blank panel 1B with the holes f1a and f2a of the rack 2 having a misalignment.

Even though the holes 11b and 21b are enlarged, when the blank panel 1B is mounted obliquely, there may be the hole 11b which will be far away from the position of the hole f1a so that screwing together thereof will be difficult, and the hole 21b which will be far away from the position of the hole f2a so that screwing together thereof will be difficult. In other words, however, at least one hole 11b which will be aligned with the hole f1a and at least one hole 21b which will be aligned with the hole f2a are definitely present. Thus, when the holes 11b and f1a and the holes 21b and f2a which can be reliably aligned with each other are screwed together, the mounting of the blank panel 1B on the rack 2 is ensured.

Third Embodiment

Figure 4:
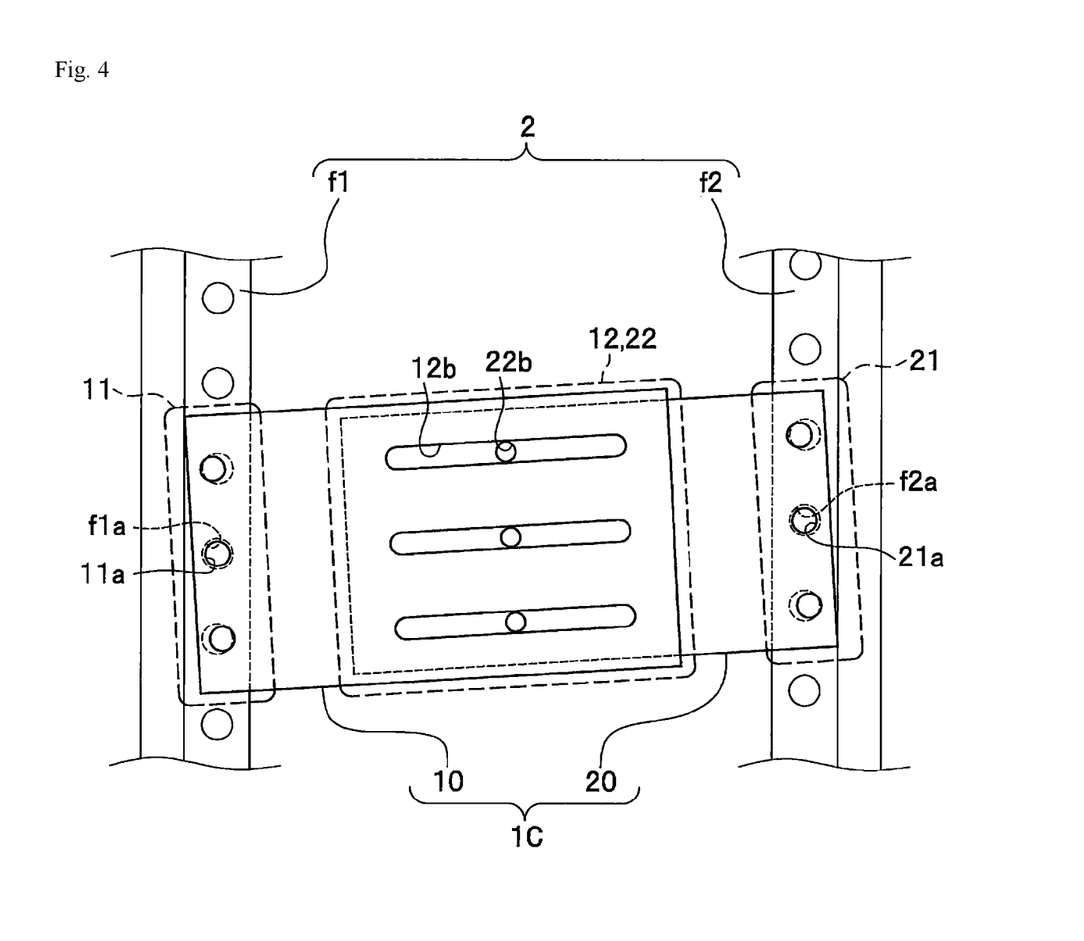
FIG. 4 is a diagram illustrating a state in which a blank panel of a third embodiment is mounted on the deformed rack.

In describing a third embodiment, description repeating that of the comparative example, the first embodiment, and the second embodiment will be omitted, and the differences will be mainly described. As illustrated in FIG. 4, a blank panel 1C of the third embodiment includes partial panels 10 and 20 which are arranged in the lateral direction.

The partial panel 10 constitutes a left half of the blank panel 1C. The partial panel 10 includes a mounting part 11 and a connection part 12. The mounting part 11 is mounted on the frame f1. The mounting part 11 is an end portion of the partial panel 10 in the lateral direction. The connection part 12 is connected to the partial panel 20. The connection part 12 is an end portion of the partial panel 10 on the side opposite to the mounting part 11 in the lateral direction.

The partial panel 20 constitutes a right half of the blank panel 1C. The partial panel 20 includes a mounting part 21 and a connection part 22. The mounting part 21 is mounted on the frame f2. The mounting part 21 is an end portion of the partial panel 20 in the lateral direction. The connection part 22 is connected to the partial panel 10. The connection part 22 is an end portion of the partial panel 20 on the side opposite to the mounting part 21 in the lateral direction.

The blank panel 1C includes a position adjustment mechanism in the lateral direction on the connection part 12 of the partial panel 10 and the connection part 22 of the partial panel 20. Specifically, the connection part 12 of the partial panel 10 has a long hole 12b which extends in the lateral direction. Further, the connection part 22 of the partial panel 20 has a hole 22b. When the connection part 12 overlaps the connection part 22 in a mounting direction of the blank panel 1C (hereinafter, this may be referred to simply as a "mounting direction"), parts of the long hole 12b and the hole 22b communicate with each other. The partial panels 10 and 20 can be connected by screwing through the long hole 12b and the hole 22b in the mounting direction.

The partial panel 10 can slide with respect to the partial panel 20 by a dimension of the long hole 12b in the lateral direction by screwing with the partial panel 20. Thus, the blank panel 1C can connect the partial panels 10 and 20 to each other and can have variable dimensions in the lateral direction by appropriately determining a position of the partial panel 10 with respect to the partial panel 20 in the lateral direction, screwing the mounting parts 11 and 21 and screwing the connection parts 12 and 22.

The connection part 12 has a step (not illustrated) in a removal direction with respect to the entire partial panel 10 (a direction opposite to the mounting direction; hereinafter, it may be simply referred to as "removal direction"). Thus, the back surface of the partial panel 10 and the back surface of the partial panel 20 are flush.

Also, in FIG. 4, for convenience of illustration, a vertical dimension of the partial panel 10 is illustrated as being slightly larger than a vertical dimension of the partial panel 20, but the present invention is not limited to that illustrated, and for example, the same longitudinal dimensions may be applied.

As illustrated in FIG. 4, the blank panel 1C is obliquely mounted on the rack 2. At this time, the partial panels 10 and 20 can be connected by the position adjustment mechanism of the blank panel 1C so that the dimension in the lateral direction increases. Thus, when the hole 11a is aligned with the position of the hole f1a, the hole 21a can reach the position of the hole f2a. In other words, the holes 11a and 21a can absorb the misalignment with the holes f1a and f2a respectively. Thus, the blank panel 1C can solve the third problem to ensure the mounting of the blank panel 1C on the rack 2.

A mechanism (the position adjustment mechanism) for adjusting the position of the partial panel 10 with respect to the partial panel 20 constitutes an alignment mechanism for aligning the holes 11a and 21a of the blank panel 1C with the holes f1a and f2a of the rack 2 having a misalignment.

Even with the increased lateral dimension of the blank panel 1C, when the blank panel 1C is mounted obliquely, there may be the hole 11a which will be far away from the position of the hole f1a so that screwing together thereof will be difficult and the hole 21a which will be far away from the position of the hole f2a so that screwing together thereof will be difficult, for example, due to interference between the blank panel 1C and the rack 2. In other words, however, at least one hole 11a which will be aligned with the hole f1a and at least one hole 21a which will be aligned with the hole f2a are definitely present. Thus, when the holes 11a and f1a and the holes 21a and f2a which can be reliably aligned with each other are screwed together, the mounting of the blank panel 1C on the rack 2 is ensured.

Modified Example of Third Embodiment

Figure 5:
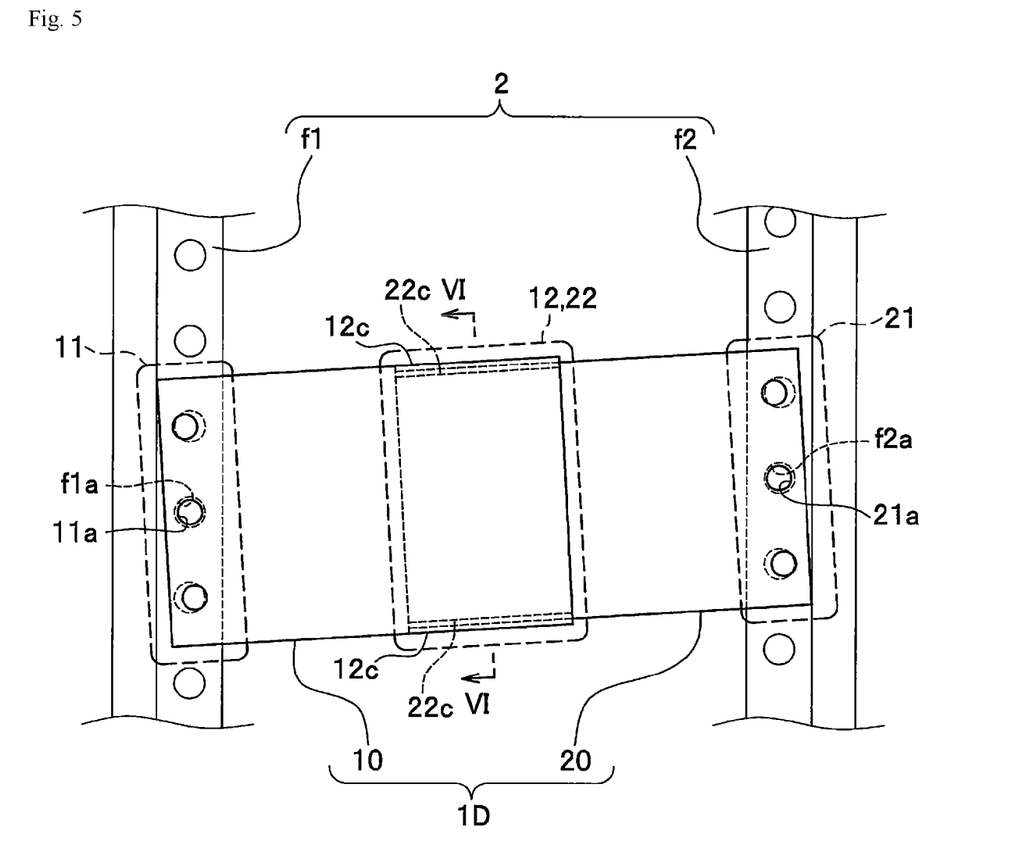
FIG. 5 is a diagram illustrating a state in which a modified example of the blank panel of the third embodiment is mounted on the deformed rack.

In addition, as illustrated in FIG. 5, a blank panel 1D can be configured as a modified example of the third embodiment. The blank panel 1D includes partial panels 10 and 20 which are arranged in the lateral direction.

The connection part 12 of the partial panel 10 includes a locking part 12c which stands upright with respect to the partial panel 10 in the mounting direction. Further, the connection part 22 of the partial panel 20 includes a locking part 22c which stands upright with respect to the partial panel 20 in the mounting direction. Holes such as those in the blank panel 1C or the like are not formed in the connection parts 12 and 22 of the blank panel 1D, but may also be formed therein.

Figure 6:
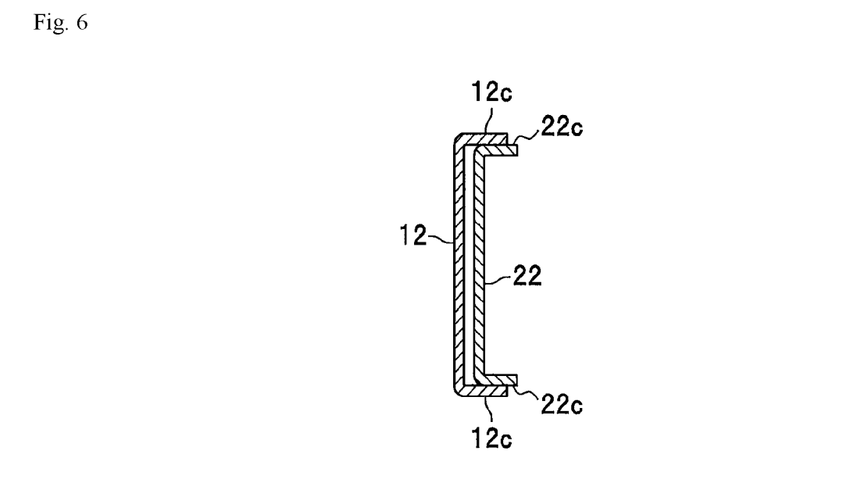
FIG. 6 is a cross-sectional view taken along line VI-VI in FIG. 5.

The vertical width of the connection part 12 of the partial panel 10 is slightly greater than the vertical width of the connection part 22 of the partial panel 20. Thus, as illustrated in FIG. 6, when the partial panels 10 and 20 are connected to each other, the connection part 12 on which the locking part 12c stands upright can surround the connection part 22 on which the locking part 22c stands upright in the mounting direction. In the modified example of the third embodiment, the connection between the partial panels 10 and 20 may be realized as an enclosure of the connection part 22 by the connection part 12, or may be realized by screwing in a case in which the holes are formed therein as in the blank panel 1C or the like.

As illustrated in FIG. 5, the blank panel 1D is mounted on the rack 2 obliquely. At this time, the partial panels 10 and 20 can be connected by the position adjustment mechanism of the blank panel 1D so that the dimension in the lateral direction increases. Thus, when the hole 11a is aligned with the position of the hole f1a, the hole 21a can reach the position of the hole f2a. In other words, the holes 11a and 21a can absorb the misalignment with the holes f1a and f2a respectively. Thus, the blank panel 1D can solve the third problem to ensure the mounting of the blank panel 1D on the rack 2.

A mechanism (the position adjustment mechanism) for adjusting the position of the partial panel 10 with respect to the partial panel 20 constitutes an alignment mechanism for aligning the holes 11a and 21a of the blank panel 1D with the holes f1a and f2a of the rack 2 having a misalignment.

Even with the increased lateral dimension of the blank panel 1D, when the blank panel 1D is mounted obliquely, there may be the hole 11a which will be far away from the position of the hole f1a so that screwing together thereof will be difficult, and the hole 21a which will be far away from the position of the hole f2a so that screwing together thereof will be difficult, for example, due to interference between the blank panel 1D and the rack 2. In other words, however, at least one hole 11a which will be aligned with the hole f1a and at least one hole 21a which will be aligned with the hole f2a are definitely present. Thus, when the holes 11a and f1a and the holes 21a and f2a which can be reliably aligned with each other are screwed together, the mounting of the blank panel 1D on the rack 2 is ensured.

Fourth Embodiment

The features described in the comparative example, the first to third embodiments, and the modified examples of the third embodiment can be combined as appropriate.

Effects

As described above, the blank panels (1A to 1D) of the present embodiments are characterized in that, when the blank panels (1A to 1D) having blank panel side holes (the holes 11a, 21a, 11b, and 21b) are obliquely mounted on the rack (2) having rack side holes (the holes f1a and f2a), an alignment mechanism which aligns the blank panel side holes with the rack side holes having a misalignment is provided.

Thus, it can be ensured that at least one rack side hole and at least one blank panel side hole which can be made to communicate, for example, for screwing will be present on both sides of the blank panels (1A to 1D).

Thus, the mounting of the blank panels (1A to 1D) on the rack 2 can be ensured even when the rack 2 is deformed.

The blank panel (1A) of the present embodiment is also characterized in that the alignment mechanism includes a mechanism which causes the blank panel 1A to have a shape in which the corners of the blank panel 1A are cut out.

Thus, because the side portion of the blank panel (1A) is formed to be small, the blank panel (1A) does not come into contact with the rack 2 to interfere with the rack 2 even when it is mounted obliquely. As a result, at least one rack side hole and at least one blank panel side hole are definitely present on both sides of the blank panel (1A), for example, which can be made to communicate for screwing.

The blank panel (1B) of the present embodiment is also characterized in that the alignment mechanism includes a mechanism in which the size of the blank panel side holes (holes 11b and 21b) is made large enough to communicate with the entire rack side holes (holes f1a and f2a) having a misalignment.

Thus, at least one rack side hole and at least one blank panel side hole are definitely present on both sides of the blank panel (1B), for example, which can be made to communicate for screwing.

The blank panels (1C and 1D) of the present embodiments are also characterized in that the blank panels (1C and 1D) include a first partial panel (the partial panel 10) and a second partial panel (the partial panel 20), and the alignment mechanism includes a mechanism (the connection parts 12 and 22, the long hole 12b, and hole 22b) for adjusting the position of the first partial panel with respect to the second partial panel.

Thus, dimensions of the blank panels (1C and 1D) in one direction can be changed so that the blank panel side hole reaches the rack side hole. Thus, at least one rack side hole and at least one blank panel side hole are definitely present on both sides of the blank panels (1C and 1D), for example, which can be made to communicate for screwing.

The blank panel (1A) of the present embodiment is also characterized in that the alignment mechanism further includes a mechanism in which the size of the blank panel side holes (the holes 11b and 21b) is made large enough to communicate with the entire rack side holes (the holes f1a and f2a) having a misalignment.

As a result, at least one rack side hole and at least one blank panel side hole are definitely present on both sides of the blank panel (1A), for example, which can be made to communicate for screwing.

The blank panel (1A) of the present embodiment is also characterized in that the blank panel (1A) includes a first partial panel (the partial panel 10) and a second partial panel (the partial panel 20), and the alignment mechanism includes a mechanism (the connection parts 12 and 22, the long hole 12b, and the hole 22b) for adjusting the position of the first partial panel with respect to the second partial panel.

Thus, the dimension of the blank panel (1A) in one direction can be changed so that the blank panel side hole reaches the rack side hole. As a result, at least one rack side hole and at least one blank panel side hole are definitely present on both sides of the blank panel (1A), for example, which can be made to communicate for screwing.

The blank panel (1B) of the present embodiment is also characterized in that the blank panel (1B) includes a first partial panel (the partial panel 10) and a second partial panel (the partial panel 20), and the alignment mechanism includes a mechanism (the connection parts 12 and 22, the long hole 12b, and the hole 22b) for adjusting the position of the first partial panel with respect to the second partial panel.

Thus, the dimension of the blank panel (1B) in one direction can be changed so that the blank panel side hole reaches the rack side hole. Thus, at least one rack side hole and at least one blank panel side hole are definitely present on both sides of the blank panel (1B), for example, which can be made to communicate for screwing.

The blank panel (1A) of the present embodiment is also characterized in that the blank panel (1A) includes a first partial panel (the partial panel 10) and a second partial panel (the partial panel 20), and the alignment mechanism includes a mechanism (the connection parts 12 and 22, the long hole 12b, and the hole 22b) for adjusting the position of the first partial panel with respect to the second partial panel.

Thus, the dimension of the blank panel (1A) in one direction can be changed so that the blank panel side hole reaches the rack side hole. Thus, for example, at least one rack side hole and at least one blank panel side hole are definitely present on both sides of the blank panel (1A), for example, which can be made to communicate for screwing.

Others (a): The structure of the rack 2 used in each of the embodiments extends vertically, but the blank panel of the present invention can be applied to a rack which extends to the left and right.

(b): The blank panels 1A to 1D described in each of the embodiments are mounted on the rack 2 by screwing. However, for example, the blank panels 1A to 1D may be mounted on the rack 2 by a fitting mechanism in which the blank panels 1A to 1D have a protrusion (or a recess) for fitting, and the rack 2 has a recess (or a protrusion) for fitting. In this case, the alignment mechanism serves as a mechanism for aligning the protrusion (or the recess) with the recess (or the protrusion).

(c): In the first embodiment, the shape of the blank panel 1A is formed to have a hexagonal shape with four corners cut out in a straight line. However, for example, the shape of the blank panel 1A may be an octagonal shape in which four corners are cut out in a straight line, or the cut-out portions may have a rounded shape.

REFERENCE SIGNS LIST 1A to 1D Blank panel
2 Rack f
f1, f2 Frame
10, 20 Partial panel
11, 21 Mounting part
12, 22 Connection part
f1a, f2a Hole (rack side hole)
11a, 21a, 11b, 21b Hole (blank panel side hole)
12b Long hole
22b Hole
12c, 22c Locking part

The invention claimed is:

1. A blank panel, comprising:
an alignment mechanism configured to align a mounting portion having a blank panel side hole with a rack side hole having a misalignment, when the blank panel having the blank panel side hole is mounted obliquely on a rack having the rack side hole, wherein the mounting portion extends laterally in a similar plane as the blank panel.

2. The blank panel according to claim 1, wherein the alignment mechanism includes a mechanism which causes the blank panel to have a shape in which corners of the blank panel are cut out.

3. The blank panel according to claim 2, wherein the alignment mechanism further includes a mechanism in which a size of the blank panel side hole is made large enough to communicate with an entire rack side hole having the misalignment.

4. The blank panel according to claim 3, wherein the blank panel includes a first partial panel and a second partial panel, and
the alignment mechanism further includes a mechanism which adjusts a position of the first partial panel with respect to the second partial panel.

5. The blank panel according to claim 2, wherein the blank panel includes a first partial panel and a second partial panel, and
the alignment mechanism further includes a mechanism which adjusts a position of the first partial panel with respect to the second partial panel.

6. The blank panel according to claim 1, wherein the alignment mechanism includes a mechanism in which a size of the blank panel side hole is made large enough to communicate with an entire rack side hole having the misalignment.

7. The blank panel according to claim 6, wherein the blank panel includes a first partial panel and a second partial panel, and
the alignment mechanism further includes a mechanism which adjusts a position of the first partial panel with respect to the second partial panel.

8. The blank panel according to claim 1, wherein the blank panel includes a first partial panel and a second partial panel, and
the alignment mechanism includes a mechanism which adjusts a position of the first partial panel with respect to the second partial panel.

9. A method comprising:
aligning a mounting portion having a blank panel side hole with a rack side hole having a misalignment, when a blank panel having the blank panel side hole is mounted obliquely on a rack having the rack side hole, wherein the mounting portion extends laterally in a similar plane as the blank panel.

10. The method according to claim 9, comprising:
adjusting a shape of the blank panel in which corners of the blank panel are cut out.

11. The method according to claim 10, comprising:
adjusting a size of the blank panel side hole to be large enough to communicate with an entire rack side hole having the misalignment.

12. The method according to claim 11, wherein the blank panel includes a first partial panel and a second partial panel and the method comprises:
adjusting a position of the first partial panel with respect to the second partial panel.

13. The method according to claim 10, wherein the blank panel includes a first partial panel and a second partial panel and the method comprises:
adjusting a position of the first partial panel with respect to the second partial panel.

14. The method according to claim 9, comprising:
adjusting a size of the blank panel side hole to be large enough to communicate with an entire rack side hole having the misalignment.

15. The method according to claim 14, wherein the blank panel includes a first partial panel and a second partial panel and the method comprises:
adjusting a position of the first partial panel with respect to the second partial panel.

16. The method according to claim 9, wherein the blank panel includes a first partial panel and a second partial panel and the method comprises:

adjusting a position of the first partial panel with respect to the second partial panel.

* * * * *